(12) United States Patent
Karaoguz et al.

(10) Patent No.: US 7,877,674 B2
(45) Date of Patent: Jan. 25, 2011

(54) METHOD AND SYSTEM FOR REDUNDANCY-BASED DECODING OF VOICE CONTENT IN A WIRELESS LAN SYSTEM

(75) Inventors: Jeyhan Karaoguz, Irvine, CA (US); Hooman Honary, Newport Coast, CA (US); Nambirajan Seshadri, Irvine, CA (US); Jason A. Trachewsky, Menlo Park, CA (US); Arie Heiman, Rannana (IL)

(73) Assignee: Broadcom Corporation, Irvine, CA (US)

( * ) Notice: Subject to any disclaimer, the term of this patent is extended or adjusted under 35 U.S.C. 154(b) by 1218 days.

(21) Appl. No.: 11/492,390

(22) Filed: Jul. 25, 2006

(65) Prior Publication Data

US 2008/0052604 A1 Feb. 28, 2008

(51) Int. Cl.
 *H03M 13/03* (2006.01)
(52) U.S. Cl. ........................ 714/795; 375/316
(58) Field of Classification Search ............... 714/795; 375/316; 386/98
See application file for complete search history.

(56) References Cited

U.S. PATENT DOCUMENTS 5,727,025 A * 3/1998 Maryanka .................. 375/257
7,562,278 B2 * 7/2009 Lyakh et al. ............... 714/751
2005/0238331 A1 * 10/2005 Abe et al. .................... 386/98
2008/0025300 A1 * 1/2008 Lide et al. .................. 370/389

FOREIGN PATENT DOCUMENTS

CN 1744475 3/2006
KR 10-2002-0049790 A 6/2002

OTHER PUBLICATIONS

Schurgers et al. Voice over wireless internet: performance interaction of signal processing algorithms and network protocols.IEEE Vehicular Technology Conference (VTC'9 Houston, Texas, pp. 1935-1939, May 16-22, 1999.*

* cited by examiner

*Primary Examiner*—Sam Rizk
(74) *Attorney, Agent, or Firm*—McAndrews, Held & Malloy, Ltd.

(57) ABSTRACT

Aspects of a method and system for redundancy-based decoding of voice content in a wireless local area network (WLAN) system are provided. A WLAN receiver may determine whether a decoded portion of a received packet comprises voice content and may select a redundancy-based decoder to decode a remaining portion of the packet when voice content is detected. The redundancy-based decoder may be a Viterbi decoder. The redundancy-based decoder may be selected to decode a determined number of subsequent packets or to decode subsequent packets for a determined amount of time. After decoding the remaining portion of the packet and any subsequent packets, the WLAN receiver may select a standard Viterbi decoder to decode additional received packets. The WLAN receiver may generate at least one signal to select the redundancy-based decoder and the standard Viterbi decoder.

22 Claims, 12 Drawing Sheets

METHOD AND SYSTEM FOR REDUNDANCY-BASED DECODING OF VOICE CONTENT IN A WIRELESS LAN SYSTEM

CROSS-REFERENCE TO RELATED APPLICATIONS/INCORPORATION BY REFERENCE

This patent application makes reference to: U.S. patent application Ser. No. 11/492,667 filed Jul. 25, 2006; U.S. patent application Ser. No. 11/492,391 filed Jul. 25, 2006; U.S. patent application Ser. No. 11/492,721 filed Jul. 25, 2006; and U.S. patent application Ser. No. 11/492,381 filed Jul. 25, 2006.

Each of the above stated applications is hereby incorporated by reference in its entirety.

FIELD OF THE INVENTION

Certain embodiments of the invention relate to signal handling for wireless communications. More specifically, certain embodiments of the invention relate to a method and system for redundancy-based decoding of voice content in a wireless local area network (WLAN) system.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate non-return to zero inverted (NRZI) or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received. Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Improvements in the design and implementation of optimized receivers for decoding convolutional encoded data may require modifications to the application of the MLSE algorithm, the Viterbi algorithm, and/or the MAP algorithm in accordance with the modulation method utilized in signal transmission.

In some instances, such as in cellular systems, the design and implementation of optimized receivers may be based on the ability of the receiver to improve voice or audio content decoding. In other instances, such as in wireless local area networks (WLAN), for example, the design and implementation of optimized receivers may require consideration of multiple content types that may be communicated via the network. For example, in multimedia applications, a WLAN-enabled receiver may be utilized for decoding convolutional encoded information such as audio/voice content, video content, and/or data content. The overall performance of the receiver may therefore depend on the ability of the receiver to optimize the decoding of audio/voice content, video content, and/or data content.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for redundancy-based decoding of voice content in a wireless local area network (WLAN) system, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for redundancy-based decoding of voice content in a wireless local area network (WLAN) system. A WLAN receiver may determine whether a decoded portion of a received packet comprises voice content and may select a redundancy-based decoder to decode a remaining portion of the packet when voice content is detected. The redundancy-based decoder may be a Viterbi decoder. The redundancy-based decoder may be selected to decode a determined number of subsequent packets or to decode subsequent packets for a determined amount of time. After decoding the remaining portion of the packet and any subsequent packets, the WLAN receiver may select a standard Viterbi decoder to decode additional received packets. The WLAN receiver may generate at least one signal to select the redundancy-based decoder and the standard Viterbi decoder.

Figure 1A:
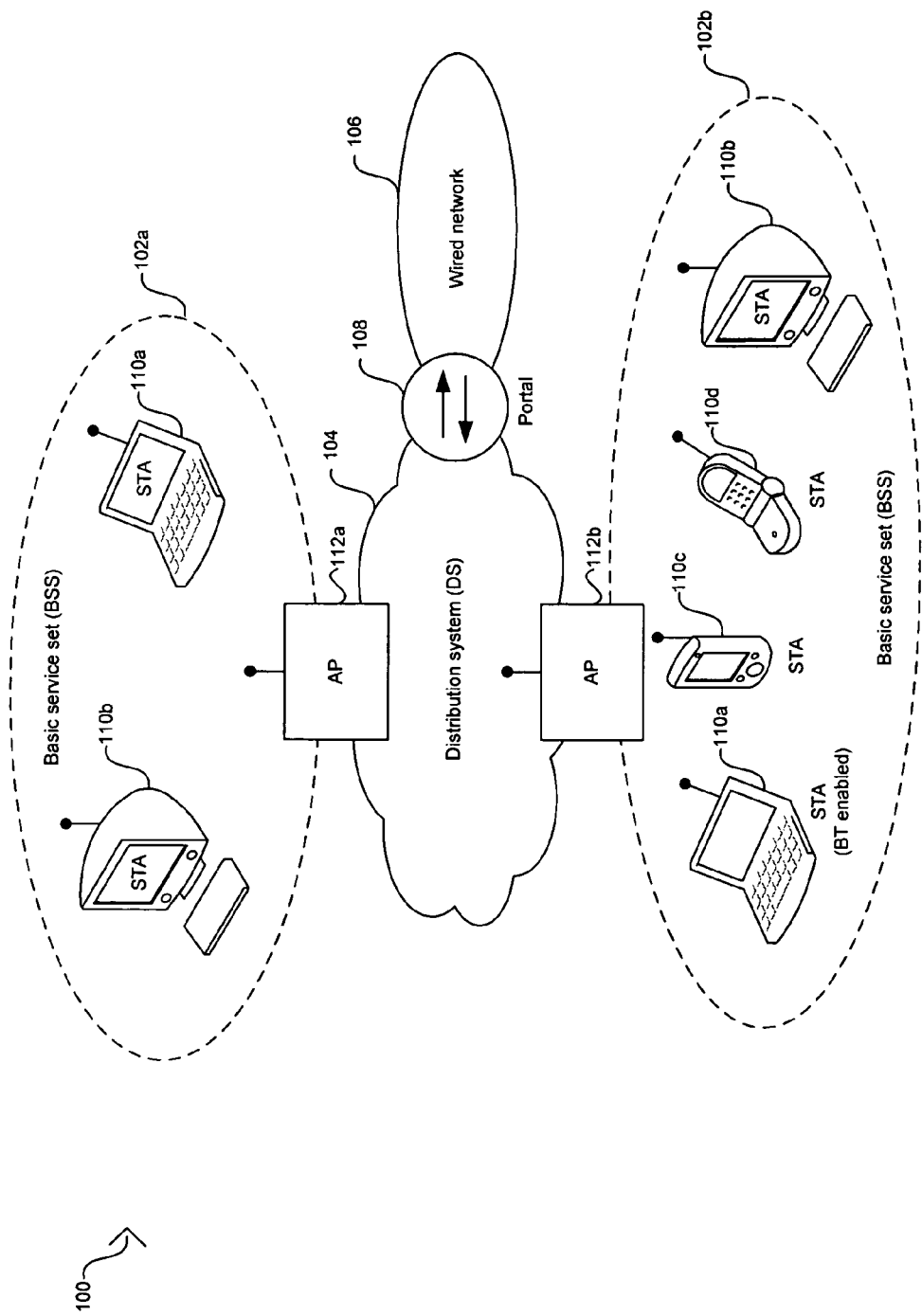
FIG. 1A is a block diagram of an exemplary WLAN infrastructure network comprising basic service sets (BSSs) integrated using a common distribution system (DS), in connection with an embodiment of the invention.

FIG. 1A is a block diagram of an exemplary WLAN infrastructure network comprising basic service sets (BSSs) integrated using a common distribution system (DS), in connection with an embodiment of the invention. Referring to FIG. 1A, the exemplary WLAN infrastructure network 100 shown may comprise a first BSS 102a, a second BSS 102b, a DS 104, a wired network 106, a portal 108, a first access point (AP) 112a, a second AP 112b, and a plurality of WLAN stations (STAs). The BSSs 102a and 102b may represent a fundamental building block of the IEEE 802.11 (WLAN) architecture and may be defined as a group of stations (STAs) that are under the direct control of a single coordination function. The geographical area covered by a BSS is known as the basic service area (BSA). The DS 104 may be utilized to integrate the BSSs 102a and 102b and may comprise suitable logic, circuitry, and/or code that may enable operation as a backbone network that is responsible for Medium Access Control (MAC) level transport in the WLAN infrastructure network 100. The DS 104, as specified by the IEEE 802.11 standard, is implementation independent. For example, the DS 104 may be implemented utilizing IEEE 802.3 Ethernet Local Area Network (LAN), IEEE 802.4 token bus LAN, IEEE 802.5 token ring LAN, Fiber Distributed Data Interface (FDDI) Metropolitan Area Network (MAN), or another IEEE 802.11 wireless medium. The DS 104 may be implemented utilizing the same physical medium as either the first BSS 102a or the second BSS 102b. However, the DS 104 is logically different from the BSSs and may be utilized only to transfer packets between the BSSs and/or to transfer packets between the BSSs and the wired network 106.

The wired network 106 may comprise suitable logic, circuitry, and/or code that may be enable providing wired networking operations. The wired network 106 may be accessed from the WLAN infrastructure network 100 via the portal 108. The portal 108 may comprise suitable logic, circuitry, and/or code that may enable integrating the WLAN infrastructure network 100 with non-IEEE 802.11 networks. Moreover, the portal 108 may also be adapted to perform the functional operations of a bridge, such as range extension and/or translation between different frame formats, in order to integrate the WLAN infrastructure network 100 with IEEE 802.11-based networks.

The APs 112a and 112b may comprise suitable logic, circuitry, and/or code that may enable range extension of the WLAN infrastructure network 100 by providing the integration points necessary for network connectivity between the BSSs. The stations 110a, 110b, 110c, and 110d associated with the APs 112a and 112b may correspond to WLAN-enabled terminals that comprise suitable logic, circuitry, and/or code that may be adapted to provide connectivity to the WLAN infrastructure network 100 via the APs. The STA 110a, STA 110c, and STA 110d shown may correspond to mobile stations or terminals within the BSS. For example, the STA 110a may be a laptop computer, the STA 110c may be a personal digital assistant (PDA), and the STA 110d may be a mobile phone. The STA 110b shown is a desktop computer and may correspond to a fixed or stationary terminal within the BSS. Each BSS may comprise a plurality of access points and/or mobile or fixed stations and need not be limited to the exemplary implementation shown in FIG. 1A.

In operation, the STAs 110a, 110b, 110c, and 110d may transmit and/or receive packets of information via the APs 102a and 102b. The APs 102a and 102b may enable the stations to communicate with other stations within the same BSS or with stations in a different BSS via the DS 104, for example. The stations may also communicate with the wired network 106 via the portal 108. In some applications, such as in voice-over-internet protocol (VoIP), the packets communicated may comprise audio and/or voice content. In other applications, such as in multimedia applications, the packets communicated may comprise audio/voice content, video content, and/or data content, for example. In this regard, each of the STAs 110a, 110b, 110c, and 110d may be enabled to process, for example, decode and/or encode, packets comprising at least one type of information content. The APs may enable indicating to the STAs when a packet and/or stream of packets comprises either audio/voice content, video content, and/or data content by, for example, setting at least one flag in the header of the packet or by indicating priorities associated with quality of service requirements for voice and/or video applications.

Figure 1B:
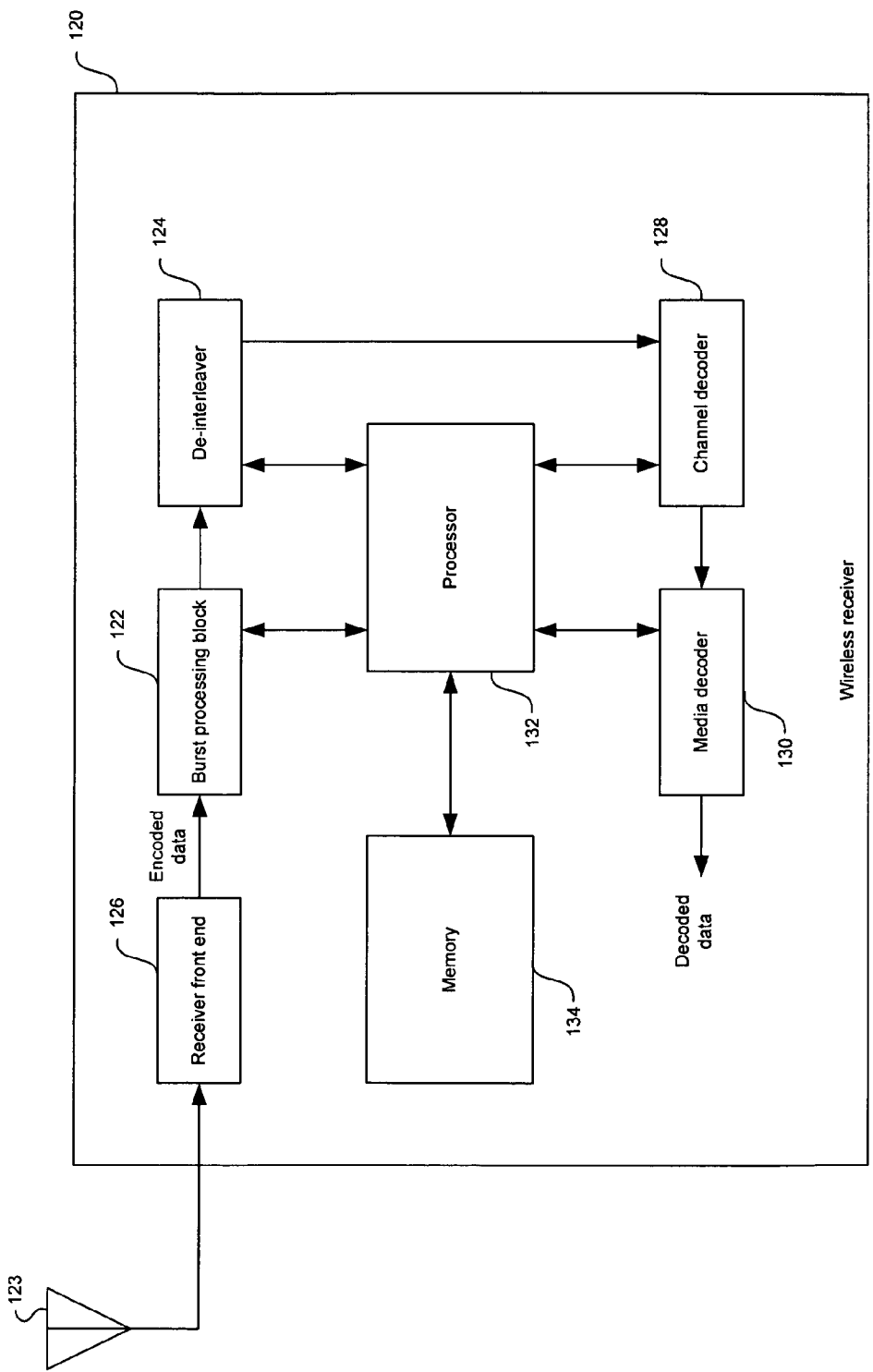
FIG. 1B is a block diagram illustrating a wireless receiver that may be utilized in a WLAN network, in accordance with an embodiment of the invention.

FIG. 1B is a block diagram illustrating a wireless receiver that may be utilized in a WLAN network, in accordance with an embodiment of the invention. Referring to FIG. 1B, there is shown a wireless receiver 120 that may comprise a receiver front end 126, a processor 132, a memory 134, a burst process block 122, a de-interleaver 124, a channel decoder 128, and a media decoder 130. The wireless receiver 120 may be, for example, a portion of a fixed or mobile WLAN-enabled station as described in FIG. 1A. The wireless receiver 120 may support more than one communication protocol, for example, the wireless receiver 120 may support at least one cellular communication protocol in addition to the WLAN communication. The wireless receiver 120 may support voice communication, such as VoIP communication, via the WLAN network, for example.

The wireless receiver 120 may comprise suitable logic, circuitry, and/or code that may enable the processing and decoding of received signals. In some instances, the received signals may be, for example, interdependent signals or signals with memory. In this regard, the wireless receiver 120 may utilize redundancy to decode interdependent signals such as signals that comprise convolutional encoded data, for example. The decoding of interdependent signals may be referred to as redundancy-based decoding. The U.S. application Ser. No. 11/189,509 filed on Jul. 26, 2005, discloses a method and system for decoding video, voice, and/or speech data using redundancy, and is hereby incorporated herein by reference in its entirety. Moreover, the wireless receiver 120 may enable the utilization of redundancy to decode interdependent signals of a particular type of information content. For example, the wireless receiver 120 may enable redundancy-based decoding of audio/voice content while applying standard decoding to other type of information content such as data, for example. Similarly, the wireless receiver 120 may enable redundancy-based decoding of video content while applying standard decoding to data content, for example.

Redundancy-based decoding algorithms may utilize redundancy and physical constraints embedded in video, voice, and/or speech data. For certain data formats, for example, the inherent redundancy of the physical constraints may result from the packaging of the data and the generation of a redundancy verification parameter, such as a cyclic redundancy check (CRC), for the packaged data. For speech applications, for example, physical constraints may include gain continuity and smoothness or consistency between consecutive inter-frames or intra-frames, pitch continuity in voice inter-frames or intra-frames, and/or consistency of line spectral frequency (LSF) parameters that may be utilized to represent a spectral envelope.

The wireless receiver 120 may be enabled to perform a burst process (BP) operation and a frame process (FP) operation when processing the received signals. In this regard, the burst process block 122 may be utilized to perform the BP operation while the channel decoder 128 and the media decoder 130 may be utilized to perform the FP operation, for example. The wireless receiver 120 may also enable a multilayer approach for improving the decoding of received signals. In this regard, results obtained in the frame process operation may be utilized to improve the performance of the burst process operation. The multilayer approach performed by the wireless receiver 100 may be compatible with a plurality of modulation standards, for example. The U.S. application Ser. No. 11 11/189,634 filed on Jul. 26, 2005, discloses a method and system for improving reception in wired and wireless receivers through redundancy and iterative processing, and is hereby incorporated herein by reference in its entirety.

The receiver front end 126 may comprise suitable logic, circuitry, and/or code that may enable receiving bit sequences from the antenna 123 and processing the received bit sequences for further processing by the burst processing block 122. The receiver front end 126 may enable analog and/or digital processing of the data received from the antenna 123. In this regard, the receiver front end 126 may generate digitized baseband samples of the data received via the antenna 123.

The burst process block 102 may comprise suitable logic, circuitry, and/or code that may enable performing a burst process portion of a decoding operation of the wireless receiver 120. The burst process block 122 may perform burst process operations for redundancy-based decoding, for example. The burst process block 122 may comprise, for example, a channel estimation operation and a channel equalization operation. Results from the channel estimation operation may be utilized by the channel equalization operation to generate a plurality of data bursts based on a maximum-likelihood sequence estimation (MLSE) operation, for example. The output of the burst process block 122 may be transferred to the de-interleaver 124. The de-interleaver 124 may comprise suitable logic, circuitry, and/or code that may enable the multiplexing of bits from a plurality of data bursts received from the burst process block 122 to form the frame inputs for the frame process operation. Interleaving may be utilized to reduce the effect of channel fading distortion, for example.

The channel decoder 128 may comprise suitable logic, circuitry, and/or code that may enable decoding of the bit sequences in the input frames received from the de-interleaver 124. The channel decoder 128 may utilize the Viterbi algorithm during a Viterbi operation to improve the decoding of the input frames. The media decoder 130 may comprise suitable logic, circuitry, and/or code that may enable performing content specific processing operations on the results of the channel decoder 128 for specified applications. Some of these applications may be video applications such as MPEG-4, enhanced full-rate (EFR) or adaptive multi-rate (AMR) speech coders used in global system for mobile (GSM) communications, and/or MP3, for example. In this regard, the media decoder 130 may be implemented as a video decoder or a voice decoder (vocoder). In this regard, the media decoder 130 may support for a plurality of specified applications.

The processor 132 may comprise suitable logic, circuitry, and/or code that may enable performing computations and/or management operations. The processor 132 may also communicate and/or control at least a portion of the operations of the burst process block 122, the de-interleaver 124, the channel decoder 128 and the media decoder 130. The memory 134 may comprise suitable logic, circuitry, and/or code that may enable storage of data and/or control information. The memory 134 may store information that may be utilized and/or that may be generated by the burst process block 122, the de-interleaver 124, the channel decoder 128 and the media decoder 130. In this regard, information may be transferred to and from the memory 134 via the processor 132, for example.

The channel decoder 128 and the media decoder 130 may perform the frame process operation of the wireless receiver 120. In this regard, a standard approach for decoding convolutional encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the source. This inherent redundancy may be utilized in the decoding process by developing a MLSE algorithm that may be enabled to meet at least some of the physical constrains of the signals source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, the source type may be a voice, music and/or a video source type, for example.

Figure 2:
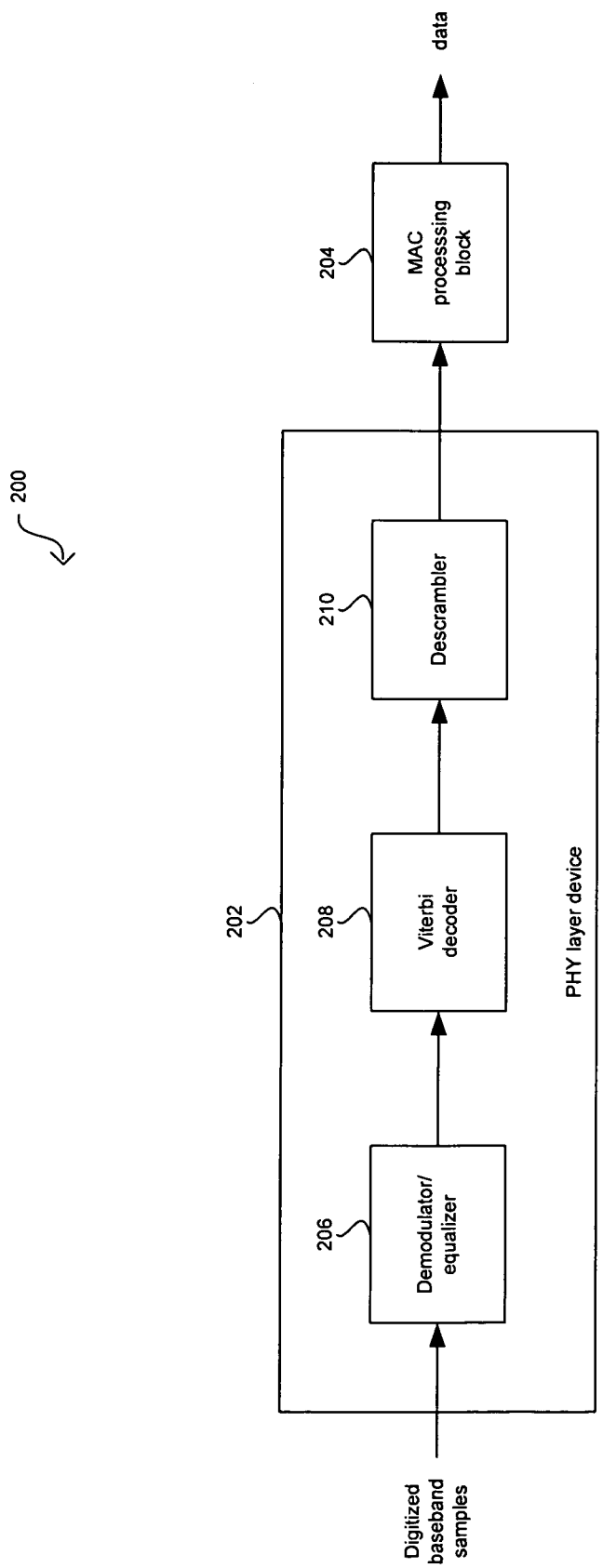
FIG. 2 is a block diagram of an exemplary WLAN receiver for data content processing, in connection with an embodiment of the invention.

FIG. 2 is a block diagram of an exemplary WLAN receiver for data content processing, in connection with an embodiment of the invention. Referring to FIG. 2, there is shown a portion of a WLAN-enabled receiver 200 that may comprise a physical (PHY) layer device 202 and a MAC processing block 204. The PHY layer device 202 may comprise a demodulator/equalizer 206, a Viterbi decoder 208, and a descrambler 210. The WLAN-enabled receiver 200 may receive data packets and may decode the data packets in a similar manner. The WLAN-enabled receiver 200 may perform content-independent decoding of received digitized baseband samples.

The demodulator/equalizer 206 may comprise suitable logic, circuitry, and/or code that may enable demodulating received digitized baseband samples. The digitized baseband samples may be received from a receiver front end such as the receiver front end 126 in FIG. 1B. The demodulator/equalizer 206 may also enable equalizing the signals based on changes that may occur in, for example, the signal channel. The Viterbi decoder 208 may comprise suitable logic, circuitry, and/or code that may enable decoding of convolutional encoded data received from the demodulator/equalizer 206. The Viterbi decoder 208 may decode independent signals or interdependent signals in a similar manner. In this regard, the Viterbi decoder 208 may be referred to as a standard Viterbi decoder that performs content-independent decoding of convolutional encoded data.

The descrambler 210 may comprise suitable logic, circuitry, and/or code that may enable descrambling the decoded data received from the Viterbi decoder 208. The MAC processing block 204 may comprise suitable logic, circuitry, and/or code that may enable handling data link layer, layer 2, content in the descrambled data received from the descrambler 210. For example, the MAC processing block 204 may be utilized to handle IEEE 802.3 Ethernet protocol information in the descrambled data received from the descrambler 210. The output of the MAC processing block 204 may be decoded data content that may be utilized by other portions of the wireless receiver 200 for further processing.

Figure 3:
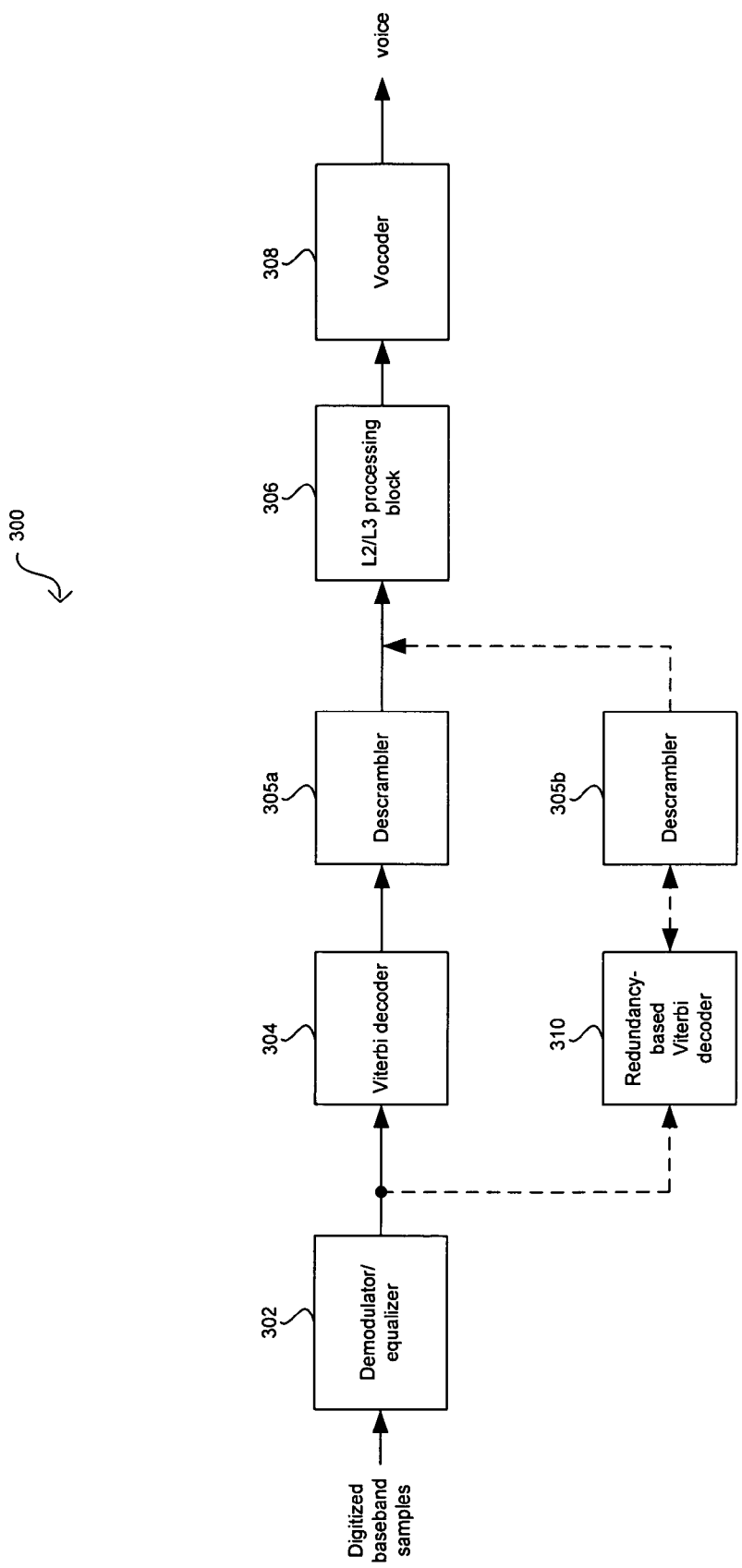
FIG. 3 is a block diagram of an exemplary WLAN receiver which may be utilized for voice content processing, in accordance with an embodiment of the invention.

FIG. 3 is a block diagram of an exemplary WLAN receiver that may be utilized for voice content processing, in accordance with an embodiment of the invention. Referring to FIG. 3, there is shown a portion of a WLAN-enabled receiver 300 that may be utilized to receive voice and/or audio content. The WLAN-enabled receiver 300 may comprise a demodulator/equalizer 302, a Viterbi decoder 304, a redundancy-based Viterbi decoder 310, descramblers 305a and 305b, a level 2/level 3 (L2/L3) processing block 306, and a vocoder 308. The WLAN-enabled receiver 300 may enable decoding of packets comprising voice, audio, and/or speech content, such as packets utilized in VoIP communications, for example. The demodulator/equalizer 302 may be the same or substantially similar to the demodulator/equalizer 206 described in FIG. 2, for example. The Viterbi decoder 304 may be the same or substantially similar to the Viterbi decoder 208 described in FIG. 2, for example. The descramblers 305a and 305b may be the same or substantially similar to the descrambler 210 in FIG. 2, for example.

The L2/L3 processing block 306 may comprise suitable logic, circuitry, and/or code that may enable handling level 2 and/or level 3 networking information in the decoded voice or speech content received from the descramblers 305a and 305b. The vocoder 308 may comprise suitable logic, circuitry, and/or code that may enable recreating the originally encoded voice or speech content based on analysis and synthesis of data received from the L2/L3 processing block 306.

In some instances, the WLAN-enabled receiver 300 may utilize a redundancy-based Viterbi decoder 310 instead of the Viterbi decoder 304. In other instances, the WLAN-enabled receiver 300 may comprise both the Viterbi decoder 304 and the redundancy-based Viterbi decoder 310 and may select between them for decoding the voice or speech content. The redundancy-based Viterbi decoder 310 may comprise suitable logic, circuitry, and/or code that may be utilized to perform decoding algorithms that may utilize redundancy and physical constraints embedded in, for example, voice, and/or speech content. The redundancy-based Viterbi decoder 310 may utilize a bi-directional connection with the descrambler 305b, for example, to enable descrambling after iterative steps provided by the redundancy-based Viterbi decoder 310. For speech applications, for example, physical constraints may include gain continuity and smoothness or consistency between consecutive inter-frames or intra-frames, pitch continuity in voice inter-frames or intra-frames, and/or consistency of LSF parameters that may be utilized to represent a spectral envelope.

Figure 4A:
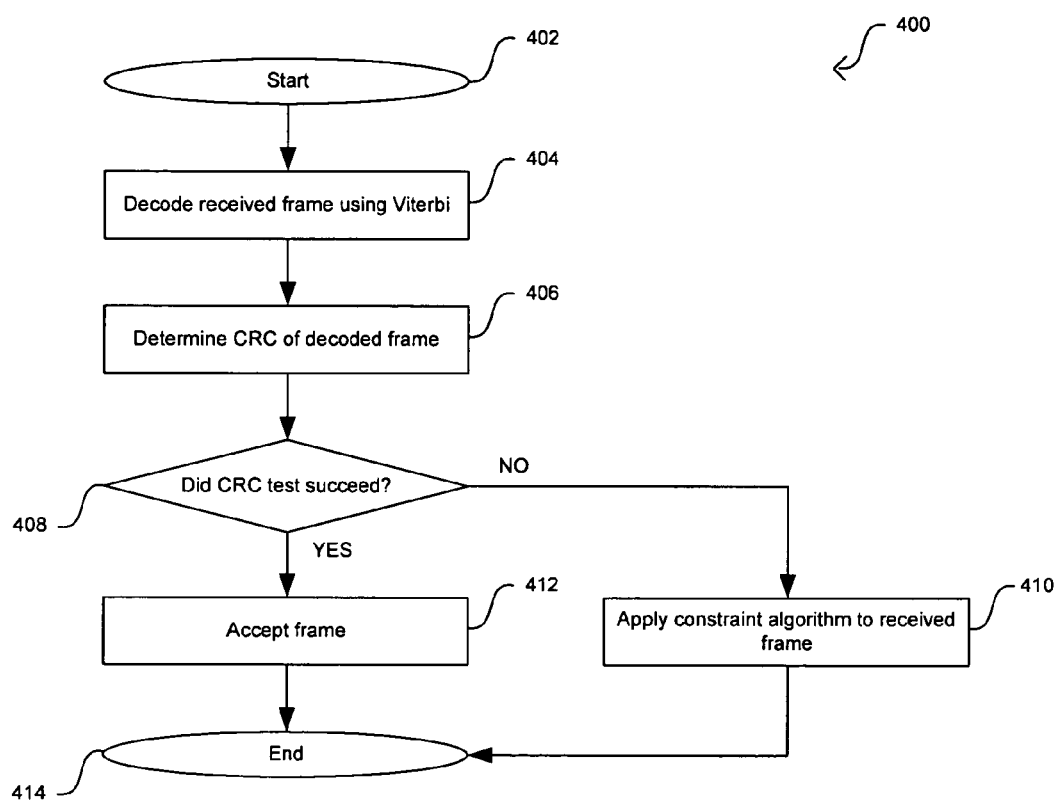
FIG. 4A is a flow diagram illustrating exemplary steps in redundancy-based Viterbi decoding of voice or speech content, in accordance with an embodiment of the invention.

FIG. 4A is a flow diagram illustrating exemplary steps in redundancy-based Viterbi decoding of voice or speech content, in accordance with an embodiment of the invention. Referring to FIG. 4A, after start step 402, in step 404, the redundancy-based Viterbi decoder 310 in FIG. 3 may decode a received voice frame by utilizing the Viterbi algorithm. In step 406, a redundancy verification parameter, such as the CRC, may be determined for the decoded frame. In step 408, the wireless receiver 120 may determine whether the CRC verification test was successful. When the CRC verifies the decoded frame, the wireless receiver 120 may proceed to step 412 where the decoded frame is accepted. After step 412, the wireless receiver 120 may proceed to end step 414.

Returning to step 408, when the CRC verification test is not successful for the decoded frame, the redundancy-based Viterbi decoder 310 may proceed to step 410. In step 410, the redundancy-based Viterbi decoder 310 may perform a redundancy-based Viterbi algorithm that may be utilized to provide a decoding performance that may result in equal or reduced decoding errors than those that may occur from utilizing the standard Viterbi algorithm. After step 410, the wireless receiver 120 may proceed to end step 414.

For voice applications over WLAN, such as VoIP, for example, the redundancy-based Viterbi algorithm may comprise searching for the MLSE that may also meet the CRC condition and the speech constraints. In this regard, a set of k bit sequences {S1, S2, . . . , Sk} may be determined from the MLSE that meet the CRC constraint. Once the set of k sequences is determined, a best sequence, Sb, may be determined that also meets the voice or speech constraints.

Figure 4B:
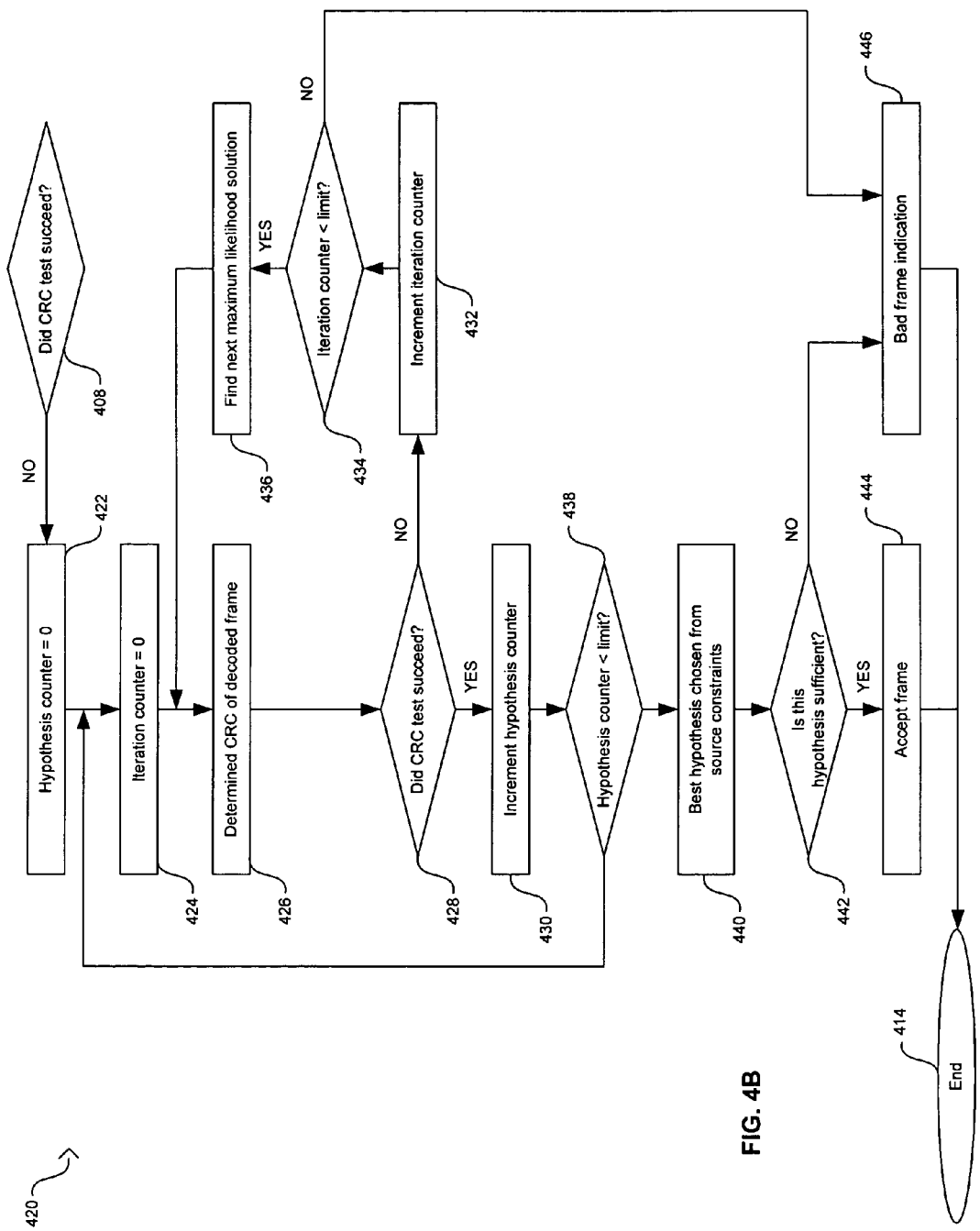
FIG. 4B is a flow diagram illustrating exemplary steps in the application of a constraint algorithm to a received voice frame, in accordance with an embodiment of the invention.

FIG. 4B is a flow diagram illustrating exemplary steps in the application of a constraint algorithm to a received voice frame, in accordance with an embodiment of the invention. Referring to FIG. 4B, when the CRC verification test is not successful for the decoded frame in step 408 in FIG. 4A, the wireless receiver 120 may proceed to step 422. In step 422, a hypothesis counter may be set to an initial counter value to indicate a first hypothesis for consideration, for example. The initial counter value in step 422 may be zero, for example. After step 422, an iteration counter may be set to an initial counter value in step 424 to indicate a first maximum likelihood solution, for example. The initial counter value in step 424 may be zero, for example. In step 426, the CRC of the decoded frame may be determined.

In step 428, the wireless receiver 120 may determine whether the CRC verification test was successful for the current hypothesis. When the CRC verification test is not successful, the operation may proceed to step 432. In step 432, the iteration counter may be incremented. After step 432, in step 434, the wireless receiver 120 may determine whether the iteration counter is less than a predetermined limit. When the iteration counter is higher or equal to the predetermined limit, the operation may proceed to step 446 where a bad frame indication is generated. When the iteration counter is less than the predetermined limit, the operation may proceed to step 436 where a next maximum likelihood solution may be determined. After step 436, the operation may proceed to step 426 where the CRC of the decoded frame may be determined based on the maximum likelihood solution determined in step 426.

Returning to step 428, when the CRC verification test is successful, the operation may proceed to step 430. In step 430, the hypothesis counter may be incremented. After step 430, in step 438, the wireless receiver 120 may determine whether the hypothesis counter is less than a predetermined limit. When the hypothesis counter is lower than the predetermined limit, the operation may proceed to step 424 where the iteration counter may be set to an initial value. When the hypothesis counter is equal to the predetermined limit, the operation may proceed to step 440 where the best hypothesis may be chosen from the source constraints.

After step 440, in step 442, the wireless receiver 120 may determine whether the best hypothesis chosen in step 440 is sufficient to accept the decoded frame. When the chosen hypothesis is sufficient to accept the decoded frame, the operation may proceed to step 444 where the decoded frame may be accepted. When the chosen hypothesis is not sufficient to accept the decoded frame, the operation may proceed to step 446 where a bad frame indication may be generated. After step 444 or step 446, the operation may proceed to end step 414 in FIG. 4A. The steps described in FIG. 4B may be performed by, for example, a redundancy-based Viterbi decoder such as the redundancy-based Viterbi decoder 310 in FIG. 3.

Figure 5A:
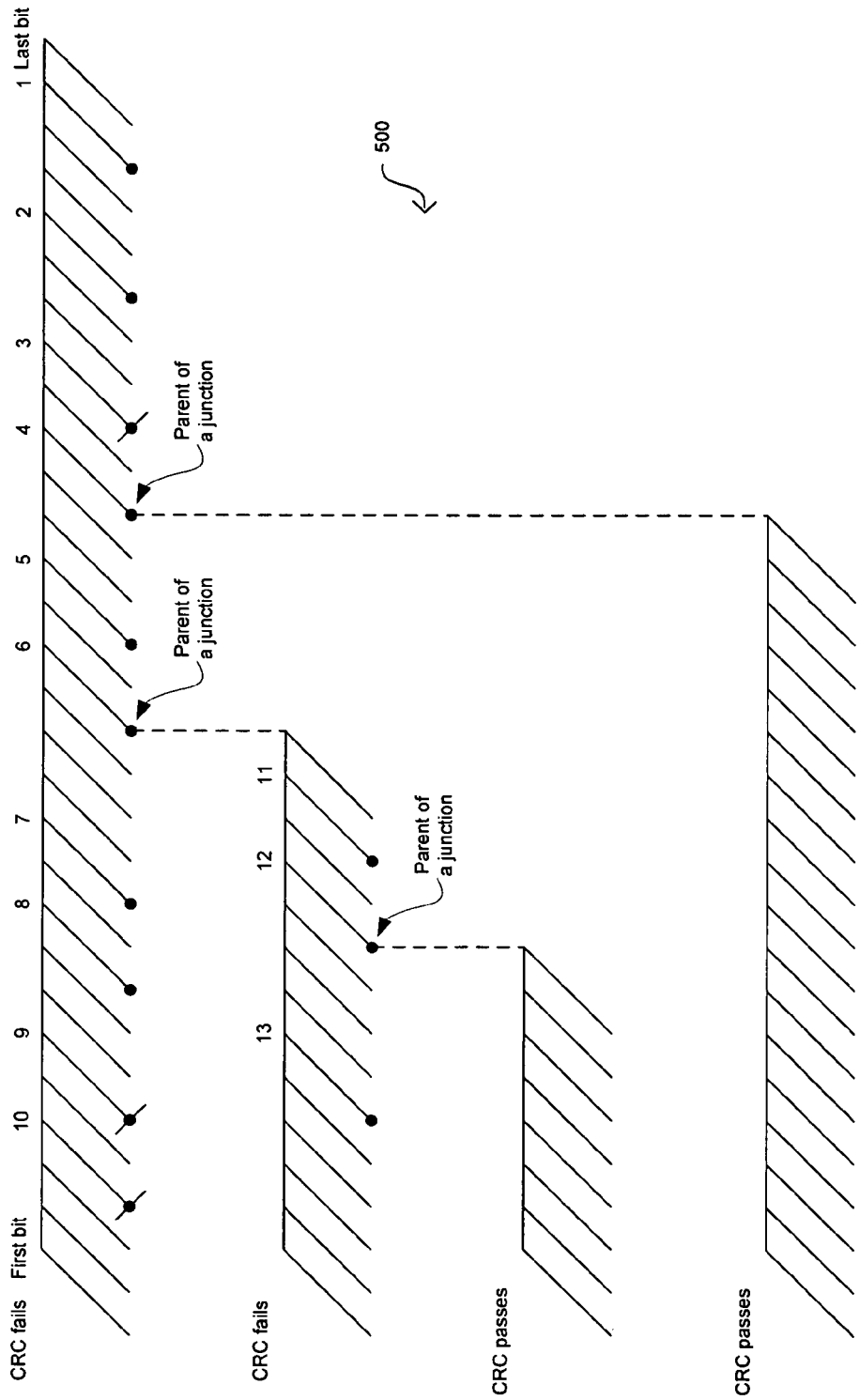
FIG. 5A is diagram illustrating an exemplary search process for a T hypothesis that meets CRC constraint for redundancy-based voice decoding, in accordance with an embodiment of the invention.

FIG. 5A is diagram illustrating an exemplary search process for a T hypothesis that meets CRC constraint for redundancy-based voice decoding, in accordance with an embodiment of the invention. Referring to FIG. 5A, the search tree 500 may correspond to an exemplary sequence search process that may start with the reduced set of estimated bit sequences generated by an initial Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for GSM may start with the selected trellis junction with the highest metric. In this example, the junction labeled 6 has the highest metric and the search process may start at that point. A new search tree 500 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be selected as one of the bit sequences for the set of k sequences {S1, S2, . . . , Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k sequences {S1, S2, . . . , Sk} may vary. The operation described in FIG. 5A may be performed by, for example, a redundancy-based Viterbi decoder such as the redundancy-based Viterbi decoder 310 in FIG. 3.

Figure 5B:
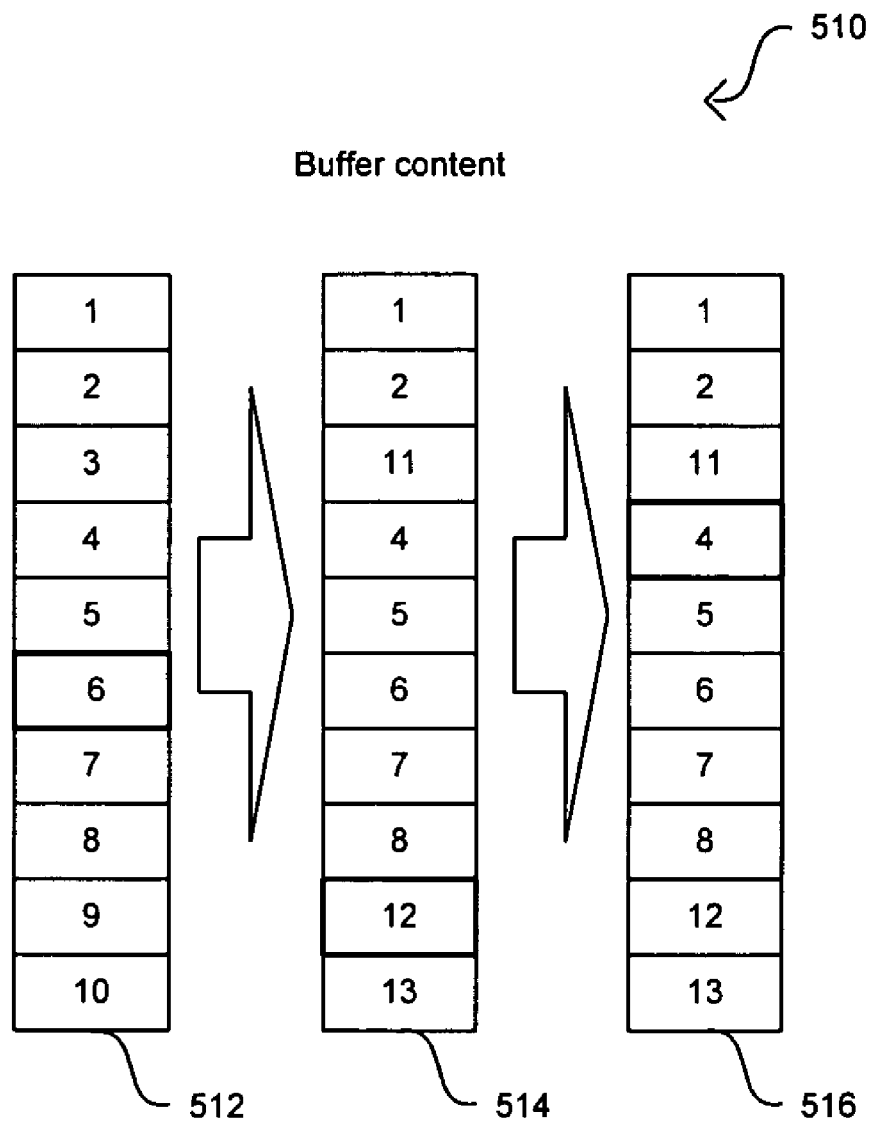
FIG. 5B is a diagram illustrating exemplary buffer content during the search process described in FIG. 5A, in accordance with an embodiment of the invention.

FIG. 5B is a diagram illustrating exemplary buffer content during the search process described in FIG. 5A, in accordance with an embodiment of the invention. Referring to FIG. 5B, there is shown a buffer content 510 in a wireless receiver, such as the wireless receiver 120 in FIG. 1B, which may correspond to the junction labels under consideration during the search process. For example, state 512 may correspond to the initial 10 junctions in the search operation. In this regard, junction 6 is highlighted to indicate that it corresponds to the highest metric value and is the starting point of a new branch or row. Step 514 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. State 516 may correspond to the next set of 10 junctions. In this instance, junction 4 is highlighted to indicate that is corresponds to the highest metric value and is the starting point of a new branch or row. Trace back pointers may be calculated at each state to track the search process.

Figure 5C:
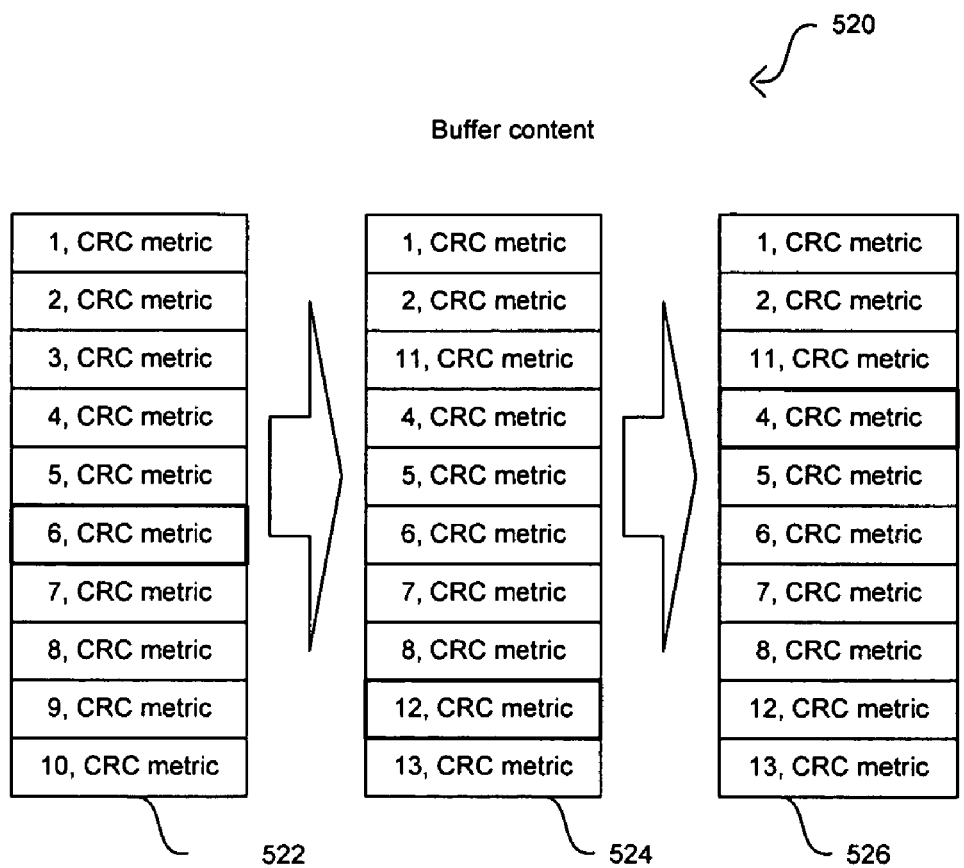
FIG. 5C is a diagram illustrating exemplary buffer content when CRC and trace back pointers are calculated simultaneously during the search process described in FIG. 5A, in accordance with an embodiment of the invention.

FIG. 5C is a diagram illustrating exemplary buffer content when CRC and trace back pointers are calculated simultaneously during the search process described in FIG. 5A, in accordance with an embodiment of the invention. Referring to FIG. 5C, there is shown a buffer content 520 in a wireless receiver, such as the wireless receiver 120 in FIG. 1B, which may correspond to the junction labels under consideration during the search process and the corresponding CRC calculations. As with FIG. 5B, the buffer content 520 may vary its contents based on a current state. For state 522, state 524, and state 526, the contents that correspond to the current junctions under consideration are the same as in state 512, state 514, and state 516 in FIG. 5B respectively. However, in order to simplify the search process for T hypothesis, the CRC and the trace back pointers for the states may be calculated simultaneously. This approach is possible because the CRC may be calculated as sum($b_i R_i$), where $R_i$ is the remainder of xi/g(x), g(x) is the generator polynomial of the CRC, and $b_i$ is the value of the bit i. The CRC metric of each sequence may be kept or stored in the buffer content 520. The CRC metric may be obtained as the sum of the $b_i R_i$ values from the junction to the last bit, and may also be determined as the sum of the parent sequence CRC metric and sum of the $b_i R_i$ values from junction to its parent. The sequence may meet the CRC condition if the CRC metric is equal to the sum of the $b_i R_i$ values from first bit to the junction. The values for $R_i$ may be stored in, for example, a look up table.

Once the set of k sequences {S1, S2, . . . , Sk} has been determined by following the search process as described in FIGS. 5A-5C, the redundancy algorithm may require that the wireless receiver 120 in FIG. 1B selects one of the bit sequences as the best bit sequence, Sb, where Sb corresponds to the bit sequence that meets the CRC constrain and the physical constrains with the highest level of confidentiality. The best bit sequence may also be referred to as the decoded output bit sequence of the multilayer process. In this regard, the best sequence bit may be selected by, for example, the redundancy-based Viterbi decoder 310 in FIG. 3.

For each of the candidate bit sequences in the set of k sequences {S1, S2, . . . , Sk}, a set of T1 different physical constraint tests, {Test(j), . . . , Test(T1)}, may be performed. The physical constraint tests correspond to tests of quantifiable characteristics of the type of data received for a particular application. The scores of the physical constraint tests for an $i^{th}$ bit sequence, {T_SC(i, j), . . . , T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

Some characteristic physical constraint tests that may be utilized by, for example, adaptive multi-rate (AMR) coding are LSF parameters, gain, and/or pitch. For the LSF parameters, some of the tests may be based on the distance between two formats, changes in consecutive LSF frames or sub-frames, and the effect of channel metrics on the thresholds. For example, the smaller the channel metric, the more difficult it is to meet the threshold. Regarding the use of gain as a physical constraint test, the criteria may be smoothness or consistency between consecutive frames or sub-frames. Regarding pitch, the criteria may be the difference in pitch between frames or sub frames.

TABLE 1

| Candidate | Test (1) | Test (2) | Test (3) | Test (4) |
|---|---|---|---|---|
| S1 | Score(1, 1) < 0 | Score(1, 2) < 0 | Score(1, 3) < 0 | Score(1, 4) < 0 |
| S2 | Score(2, 1) < 0 | Score(2, 2) > 0 | Score(2, 3) < 0 | Score(2, 4) < 0 |
| S3 | Score(3, 1) < 0 | Score(3, 2) < 0 | Score(3, 3) < 0 | Score(3, 4) < 0 |
| S4 | Score(4, 1) < 0 | Score(4, 2) < 0 | Score(4, 3) < 0 | Score(4, 4) > 0 |
| S5 | Score(5, 1) < 0 | Score(5, 2) < 0 | Score(5, 3) < 0 | Score(5, 4) < 0 |
| Bit sequence with minimum score | S3 | S5 | S3 | S3 |

Figure 6:
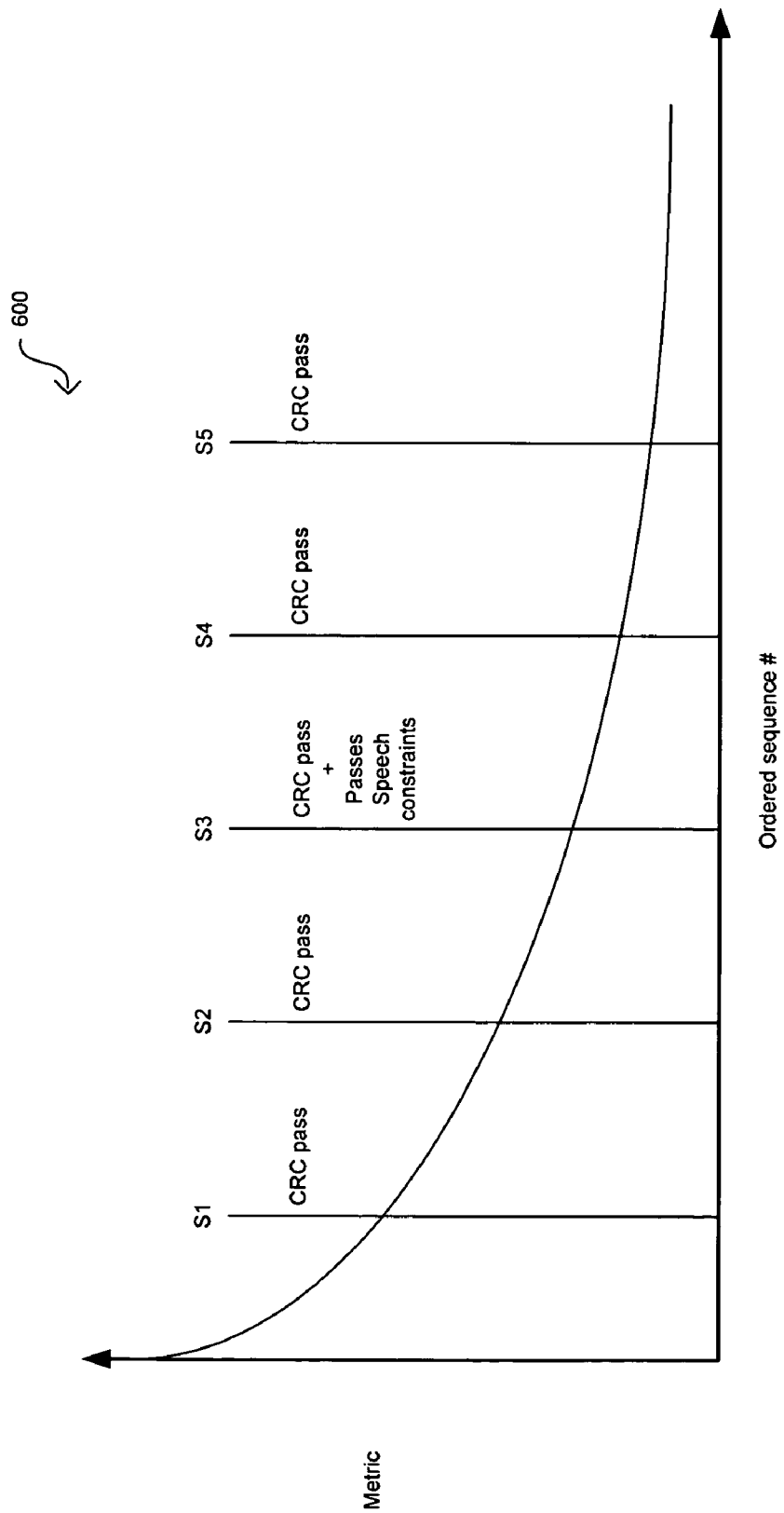
FIG. 6 is a graph illustrating exemplary set of sequences that meets CRC and speech constraints, in accordance with an embodiment of the invention.

FIG. 6 is a graph illustrating exemplary set of sequences that meets CRC and speech constraints, in accordance with an embodiment of the invention. Referring to FIG. 6, there is shown the result of the application of redundancy to the decoding of speech content in a redundancy-based Viterbi decoder, such as the redundancy-based Viterbi decoder 310 in FIG. 3. For example, the search process for T hypothesis as shown in FIGS. 5A-5C may result in the set of bit sequences {S1, S2, S3, S4, and S5}. These bit sequences were selected based on their metric values and passing the CRC verification. The set of bit sequences were also required to pass physical constraint tests as described herein. In this instance, the bit sequence S3 has been shown to meet the CRC verification and the physical constraint test and may be selected by the redundancy-based Viterbi decoder 310 as the best bit sequence, Sb.

Figure 7:
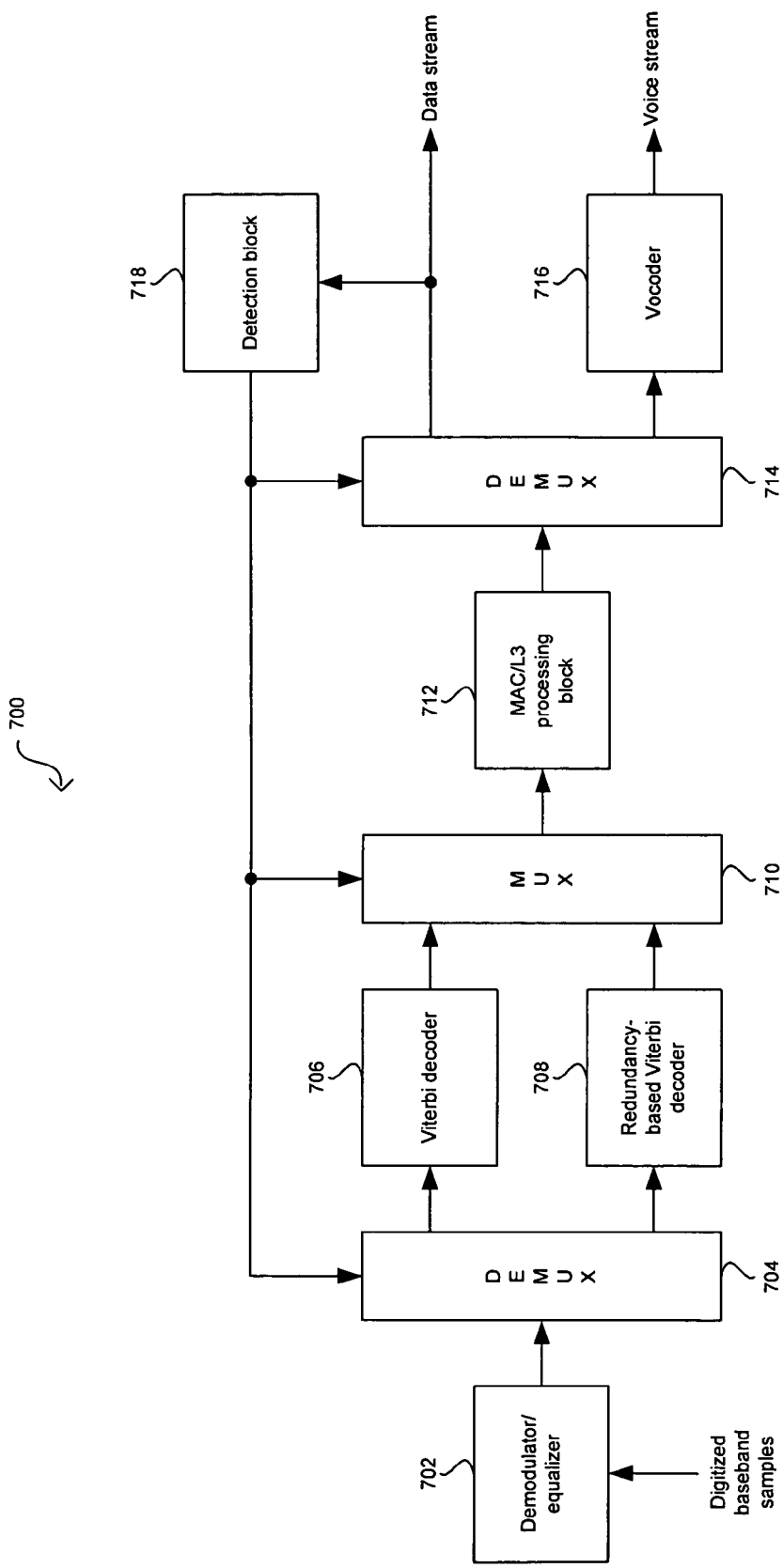
FIG. 7 is a block diagram of a portion of an exemplary WLAN receiver that utilizes redundancy-based Viterbi decoding for decoding voice content, in accordance with an embodiment of the invention.

FIG. 7 is a block diagram of a portion of an exemplary WLAN receiver that utilizes redundancy-based Viterbi decoding for decoding voice content, in accordance with an embodiment of the invention. Referring to FIG. 7, there is shown a portion of a WLAN-enabled receiver 700 that may support receiving voice content and also data content. In this regard, the voice content may be received via packets used in WLAN voice communication, such as VoIP, for example. The WLAN-enabled receiver 700 may comprise a demodulator/equalizer 702, demultiplexers (DEMUXs) 704 and 714, a multiplexer (MUX) 710, a Viterbi decoder 706, a redundancy-based Viterbi decoder 708, a MAC/L3 processing block 712, a vocoder 716, and a detection block 718.

The Viterbi decoder 706 may be utilized for general purpose decoding and may be implemented in hardware, for example. The redundancy-based Viterbi decoder 310 may be implemented using a digital signal processor (DSP) or on a processor utilized for handling Medium Access Control (MAC) information, for example.

The demodulator/equalizer 702, the Viterbi decoder 706, the redundancy-based Viterbi decoder 708, and the vocoder 716 shown in FIG. 7 may be the same or substantially similar to corresponding blocks described in FIGS. 2 and 3. The DEMUXs 704 and 714 may comprise suitable logic, circuitry, and/or code that may enable selecting one of the output ports for communicating the information provided to the input port. In this regard, at least one signal may be utilized to perform the output port selection in the DEMUXs 704 and 714. The DEMUX 704 may comprise a first output port communicatively coupled to the Viterbi decoder 706 and a second output port communicatively coupled to the redundancy-based Viterbi decoder 708. The DEMUX 714 may comprise a first output port that is communicatively coupled to the detection block 718 and a second output port that is communicatively coupled to the vocoder 716. The first output port of the DEMUX 714 may correspond to a data stream while the second output port of the DEMUX 714 may correspond to a voice or speech stream.

The MUX 710 may comprise suitable logic, circuitry, and/or code that may enable communicating the information provided to one of the input ports to the output port. In this regard, at least one signal may be utilized to perform the input port selection in the MUX 710. The MUX 710 may comprise a first input port that is communicatively coupled to the Viterbi decoder 706 and a second input port that is communicatively coupled to the redundancy-based Viterbi decoder 708.

The MAC/L3 processing block 712 may comprise suitable logic, circuitry, and/or code that may enable handling of MAC information for decoded data content and/or handling level 3 networking information for the decoded voice or speech content. In this regard, the decoded data content may be received from the Viterbi decoder 706 via the MUX 710 while the decoded voice or speech content may be received from the redundancy-based Viterbi decoder 708 via the MUX 710.

The detection block 718 may comprise suitable logic, circuitry, and/or code that may enable detecting voice content within a decoded packet. The detection block 718 may generate at least one signal to select the appropriate output port in the DEMUXs 704 and 714 and to select the appropriate input port in the MUX 710 during a normal mode of operation and when voice content is detected in a decoded packet.

In some instances, a WLAN access point, such as the AP 112a and AP 112b in FIG. 1, for example, may enable a flag in the header of a packet to indicate that the packet comprises voice content. For example, the IEEE 802.11 protocol supports reserved fields in the packet header for description of content. The access point may enable setting a flag in the reserved fields to indicate that the current packet is a voice packet. In this regard, the detection block 718 may detect when a packet comprises voice content based on a header flag setting provided by an access point.

Moreover, WLAN is a best effort system where MAC layer enhancements may enable the necessary quality of service for voice and/or video packets by creating priorities for those packets through better bandwidth channels. In this regard, the detection block 718 may detect when a packet or stream of packets comprises voice content based on priority information associated with quality of service.

In operation, digitized baseband samples corresponding to a received data packet may be processed by the demodulator/equalizer 702. During a normal mode of operation, the output of the demodulator/equalizer 702 may be communicated to the Viterbi decoder 706 via the DEMUX 704. In this regard, the detection block 718 may generate at least one signal to select the output port in the DEMUX 704 that is communicatively coupled to the Viterbi decoder 706. During the normal mode of operation, the decoded information generated by the Viterbi decoder 706 may be communicated to the MAC/L3 processing block 712 via the MUX 710. In this regard, the detection block 718 may generate at least one signal to select the input port in the MUX 710 that is communicatively coupled to the Viterbi decoder 706. The MAC/L3 processing block 712 may handle the decoded information received from the Viterbi decoder 712. During the normal mode of operation, the output of the MAC/L3 processing block 712 may be communicated to the data stream and to the detection block 718 via the DEMUX 714. In this regard, the detection block 718 may generate at least one signal to select the appropriate output port of the DEMUX 714. When the detection block 718 detects that at least a portion of the content of the decoded packet is voice content, the detection block 718 may generate at least one signal to be sent to the DEMUXs 704 and 714 and to the MUX 710 in order to have the remaining portion of the data packet decoded by the redundancy-based Viterbi decoder 708 and then be communicated to the vocoder 716.

The WLAN-enabled receiver 700 enables decoding of data content via the Viterbi decoder 706 during a normal mode of operation and also enables decoding of voice or speech decoding via the redundancy-based Viterbi decoder 706 when the data packets comprise voice content. This approach may enable the WLAN-enabled receiver 700 to provide better decoding performance, and therefore better quality, for voice or speech content when the voice or speech signals are interdependent and therefore contain redundant information that may be utilized as a physical constraint by the redundancy-based Viterbi decoder 708. Moreover, because voice or speech content may require clock speeds that may be slower than those necessary to process data content, utilizing the redundancy-based Viterbi decoder 708 may also result in a reduction on power used for decoding the voice or speech content in the received data packets.

The WLAN-enabled receiver 700 may enable detecting voice content in a data packet one packet at a time. For example, the WLAN-enabled receiver 700 may reset into a normal mode of operation after each packet is decoded. Moreover, the WLAN-enabled receiver 700 may enable receiving at least one signal from, for example, an access point (AP) indicating that the packets to be received by the WLAN-enabled receiver 700 for a determined amount of time comprise voice or speech content. In this regard, the WLAN-enabled receiver 700 may decode a plurality of data packets utilizing the redundancy-based Viterbi decoder 708 until the determined amount of time expires and the WLAN-enabled receiver 700 returns to the normal mode of operation. In another example, the WLAN-enabled receiver 700 may receive at least one signal from, for example, an AP indicating that a determined amount of packets to be received by the WLAN-enabled receiver 700 comprise voice or speech content. In this regard, the WLAN-enabled receiver 700 may decode the determined number of data packets that comprise voice or speech content utilizing the redundancy-based Viterbi decoder 708 and then return to the normal mode of operation. The detection block 718 may be utilized to generate at least one signal that controls the operations of the DEMUXs 704 and 714 and the MUX 710 in accordance to whether the redundancy-based Viterbi decoder 708 is utilized to decode a determined amount of packets or decode for a determined amount of time.

Figure 8:
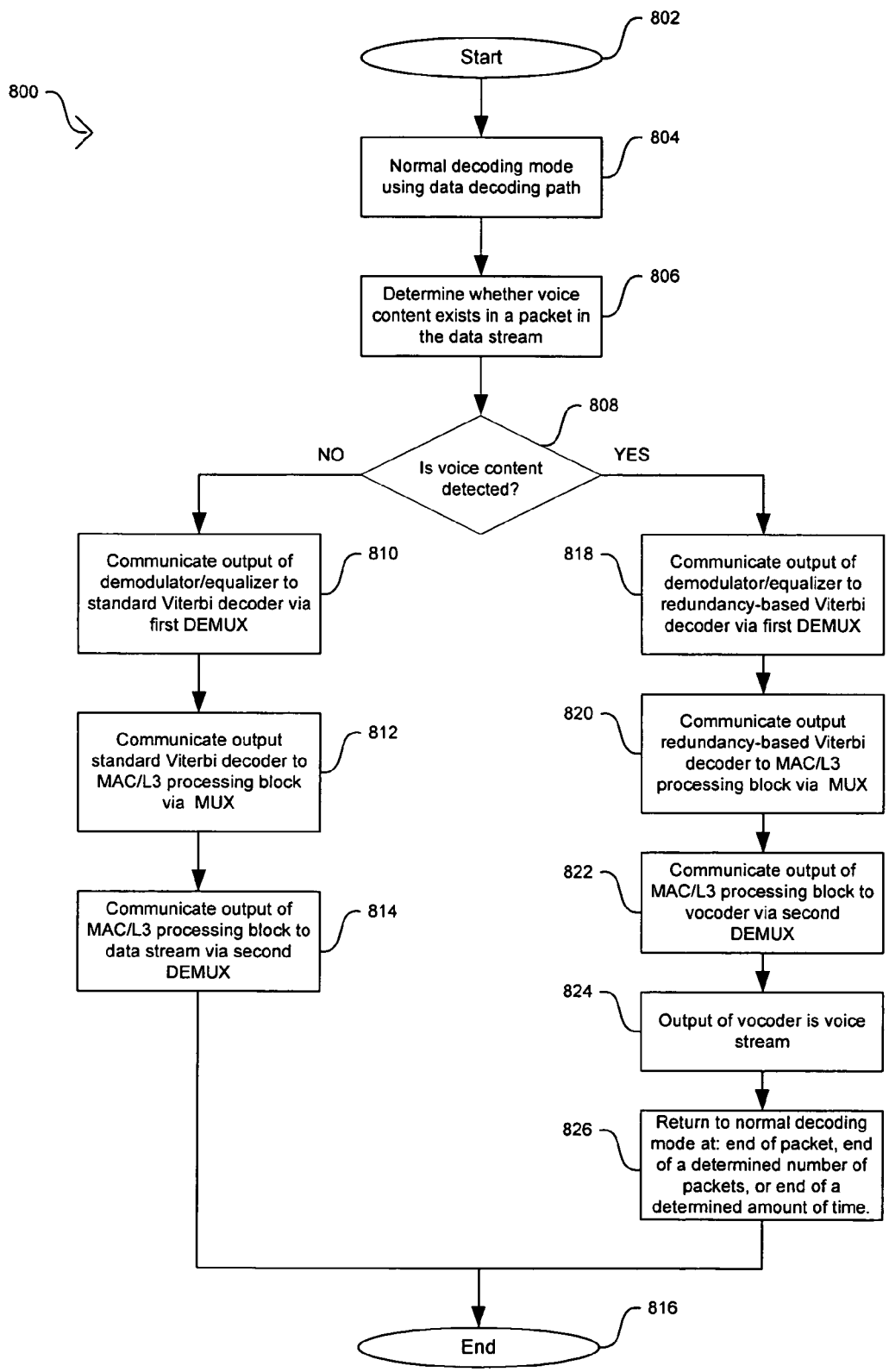
FIG. 8 is a flow diagram illustrating exemplary steps in the operation of the WLAN receiver in FIG. 7, in accordance with an embodiment of the invention.

FIG. 8 is a flow diagram illustrating exemplary steps in the operation of the WLAN receiver in FIG. 7, in accordance with an embodiment of the invention. Referring to FIG. 8, there is shown a flow chart 800. After start step 802, in step 804, the WLAN-enabled receiver 700 in FIG. 7 may operate in a normal mode of operation in which the Viterbi decoder 706 is selected for decoding the received data packet. In step 806, the detection block 718 may be utilized to detect voice or speech content in a portion of a data packet being decoded by the WLAN-enabled receiver 700. In step 808, when the decoded portion of the data packet does not comprise voice or speech content, the process may proceed to step 810.

In step 810, the detection block 718 may generate at least one signal that enables the DEMUX 704 to communicate the output of the demodulator/equalizer 702 to the Viterbi decoder 706. In step 812, the detection block 718 may generate at least one signal that enables the MUX 710 to communicate the output of the Viterbi decoder 706 to the MAC/L3 processing block 712. In step 814, the detection block 718 may generate at least one signal that enables the DEMUX 714 to communicate the output of the MAC/L3 processing block 712 to the data stream and to the detection block 718.

Returning to step 808, when the decoded portion of the data packet comprises voice or speech content, the process may proceed to step 818. In step 818, the detection block 718 may generate at least one signal that enables the DEMUX 704 to communicate the output of the demodulator/equalizer 702 to the redundancy-based Viterbi decoder 708. In step 820, the detection block 718 may generate at least one signal that enables the MUX 710 to communicate the output of the redundancy-based Viterbi decoder 708 to the MAC/L3 processing block 712. In step 822, the detection block 718 may generate at least one signal that enables the DEMUX 714 to communicate the output of the MAC/L3 processing block 712 to vocoder 716. In step 824, the vocoder 824 may generate a voice or speech stream. In step 826, the WLAN-enabled receiver 700 may return to the normal mode of operation. In this regard, a return to the normal mode of operation may occur at the end of each packet that comprises voice or speech content, or at the end of a determined amount of time, or at the end of a determined amount of data packets.

In one embodiment of the invention, a system for signal processing may comprise circuitry, such as the detection block 718, within a WLAN receiver, such as the WLAN-enabled receiver 700, which enables determining whether a decoded portion of a packet received by the WLAN receiver comprises voice content. If the decoded portion of the packet comprises voice content, the circuitry enables selecting a redundancy-based decoder, such a the redundancy-based Viterbi decoder 708, to decode at least a portion of the packet. In some instances, a processor may comprise the redundancy-based decoder. The circuitry enables in the WLAN receiver enables selecting the redundancy-based decoder to decode subsequent packets for a determined amount of time or for a determined number of subsequent packets. The circuitry may also enable selecting a non-redundancy-based decoder, such as the Viterbi decoder 796, to decode additional packets after decoding the subsequent packets using said redundancy-based decoder. The circuitry enables generating at least one signal for selecting of the redundancy-based decoder.

The approach described herein may enable a WLAN-enabled receiver that supports multiple information content types to improve the decoding performance for voice or speech content. Moreover, having capability to determine when a data packet comprises voice or speech content may aid in reducing overall power consumption since voice or speech content processing may require clock speeds that are slower than those necessary to process data content.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   determining whether a decoded portion of a packet received by a WLAN receiver comprises voice content; and
   if said decoded portion of said packet comprises voice content, selecting a redundancy-based decoder to decode at least a portion of said packet.

2. The method according to claim 1, wherein said redundancy-based decoder is a Viterbi decoder.

3. The method according to claim 1, comprising selecting said redundancy-based decoder to decode subsequent packets.

4. The method according to claim 3, comprising selecting said redundancy-based decoder to decode subsequent packets for a determined amount of time.

5. The method according to claim 3, comprising selecting said redundancy-based decoder to decode a determined number of said subsequent packets.

6. The method according to claim 3, comprising selecting a non-redundancy-based decoder to decode additional packets after decoding said subsequent packets using said redundancy-based decoder.

7. The method according to claim 1, comprising generating at least one signal for said selecting of said redundancy-based decoder.

8. A machine-readable storage having stored thereon, a computer program having at least one code section for signal processing, the at least one code section being executable by a machine for causing the machine to perform steps comprising:
   determining whether a decoded portion of a packet received by a WLAN receiver comprises voice content; and
   if said decoded portion of said packet comprises voice content, selecting a redundancy-based decoder to decode at least a portion of said packet.

9. The machine-readable storage according to claim 8, wherein said redundancy-based decoder is a Viterbi decoder.

10. The machine-readable storage according to claim 8, wherein said at least one code section comprises code for selecting said redundancy-based decoder to decode subsequent packets.

11. The machine-readable storage according to claim 10, wherein said at least one code section comprises code for selecting said redundancy-based decoder to decode subsequent packets for a determined amount of time.

12. The machine-readable storage according to claim 10, wherein said at least one code section comprises code for selecting said redundancy-based decoder to decode a determined number of said subsequent packets.

13. The machine-readable storage according to claim 10, wherein said at least one code section comprises code for selecting a non-redundancy-based decoder to decode additional packets after decoding said subsequent packets using said redundancy-based decoder.

14. The machine-readable storage according to claim 8, wherein said at least one code section comprises code for generating at least one signal for said selecting of said redundancy-based decoder.

15. A system for signal processing, the system comprising:
circuitry within a WLAN receiver that enables determining whether a decoded portion of a packet received by said WLAN receiver comprises voice content; and
if said decoded portion of said packet comprises voice content, said circuitry enables selecting a redundancy-based decoder to decode at least a portion of said packet.

16. The system according to claim 15, wherein said redundancy-based decoder is a Viterbi decoder.

17. The system according to claim 15, wherein a processor in said WLAN receiver comprises said redundancy-based decoder.

18. The system according to claim 15, wherein said circuitry enables selecting said redundancy-based decoder to decode subsequent packets.

19. The system according to claim 18, wherein said circuitry enables selecting said redundancy-based decoder to decode subsequent packets for a determined amount of time.

20. The system according to claim 18, wherein said circuitry enables selecting said redundancy-based decoder to decode a determined number of said subsequent packets.

21. The system according to claim 18, wherein said circuitry enables selecting a non-redundancy-based decoder to decode additional packets after decoding said subsequent packets using said redundancy-based decoder.

22. The system according to claim 15, wherein said circuitry enables generating at least one signal for said selecting of said redundancy-based decoder.

\* \* \* \* \*